United States Patent
Maltabas et al.

(10) Patent No.: US 11,088,683 B1
(45) Date of Patent: Aug. 10, 2021

(54) RECONFIGURABLE CLOCK FLIPPING SCHEME FOR DUTY CYCLE MEASUREMENT

(71) Applicant: Apple Inc., Cupertino, CA (US)

(72) Inventors: Samed Maltabas, Santa Clara, CA (US); Khaled M. Alashmouny, Campbell, CA (US); Dennis M. Fischette, Jr., Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/031,726

(22) Filed: Sep. 24, 2020

(51) Int. Cl.
*H03K 5/156* (2006.01)
(52) U.S. Cl.
CPC .................. *H03K 5/1565* (2013.01)
(58) Field of Classification Search
None
See application file for complete search history.

(56) References Cited

U.S. PATENT DOCUMENTS

| | | | |
|---|---|---|---|
| 7,126,407 B2 | 10/2006 | Furtner | |
| 8,686,764 B2 | 4/2014 | Bulzacchelli et al. | |
| 9,780,768 B2 | 10/2017 | Elbadry et al. | |
| 10,630,272 B1 * | 4/2020 | Ashtiani | H03K 5/133 |

* cited by examiner

*Primary Examiner* — Cassandra F Cox
(74) *Attorney, Agent, or Firm* — Kowert, Hood, Munyon, Rankin & Goetzel, P.C.

(57) ABSTRACT

A clock test system included in a computer system includes a clock generator circuit that generates multiple clock signals. A switch circuit selects different ones of the multiple clock signals during different time periods to generate an output clock signal. A measurement circuit measures a duty cycle of the output clock signals during the different time periods to generate multiple duty cycle measures. The measurement circuit uses the multiple duty cycle measurements to cancel a portion of duty cycle distortion in the output clock signal to determine an adjusted duty cycle value.

20 Claims, 14 Drawing Sheets

RECONFIGURABLE CLOCK FLIPPING SCHEME FOR DUTY CYCLE MEASUREMENT

BACKGROUND

Technical Field

This disclosure relates to duty cycle measurement of a clock signal, in particular to reducing both random and deterministic noise from duty cycle measurements of a clock signal.

Description of the Related Art

Computer systems often employ periodic signals (often referred to as "clock signals") to relay timing information to different circuits included in such computer systems. The timing information may be used by latch or flip-flop circuits to sample and hold data. Additionally, the timing information may be used to send and receive data between different circuit blocks within an integrated circuit, or between different integrated circuits.

Clock signals may be generated using a variety of circuits and techniques. In some cases, a main clock signal may be generated using a crystal oscillator circuit. Phase-locked loop or delayed-locked loop circuits may be employed to generate other clock signals of differing frequencies and phases relative to the main clock signal.

Some circuits may use either a rising or falling edge of a clock signal to perform their respective functions. Other circuits, however, may rely on the both the rising and falling edges of the clock signal the perform their respective functions. Some communication protocols, e.g., double-data rate, also relay on both edges of a clock signal.

SUMMARY OF THE EMBODIMENTS

Various embodiments of different combinations of clock test system are disclosed. Broadly speaking, a clock generator circuit is configured to generate a plurality of clock signals having a common frequency. A switch circuit coupled to the clock generator circuit is configured to select, during a first time period, a first clock signal of the plurality of clock signals as a first output clock signal. The switch circuit is also configured to select, during a second time period, a second clock signal of the plurality of clock signals as the first output clock signal. A measurement circuit is configured to measure a duty cycle of the first output clock signal during the first and second time periods to generate respective duty cycle values, and determine an adjusted duty cycle of the first output clock signal using the respective duty cycle values. In cases where the first and second clock signals have opposite logical polarities, switching between the first and second clock signals may allow for the cancelation of static offsets in the duty-cycle distortion measurement, thereby improving the accuracy of the duty-cycle distortion measurement allowing for more precise calibration and correction of the duty cycle of the clock signal.

DETAILED DESCRIPTION OF EMBODIMENTS

Figure 1:
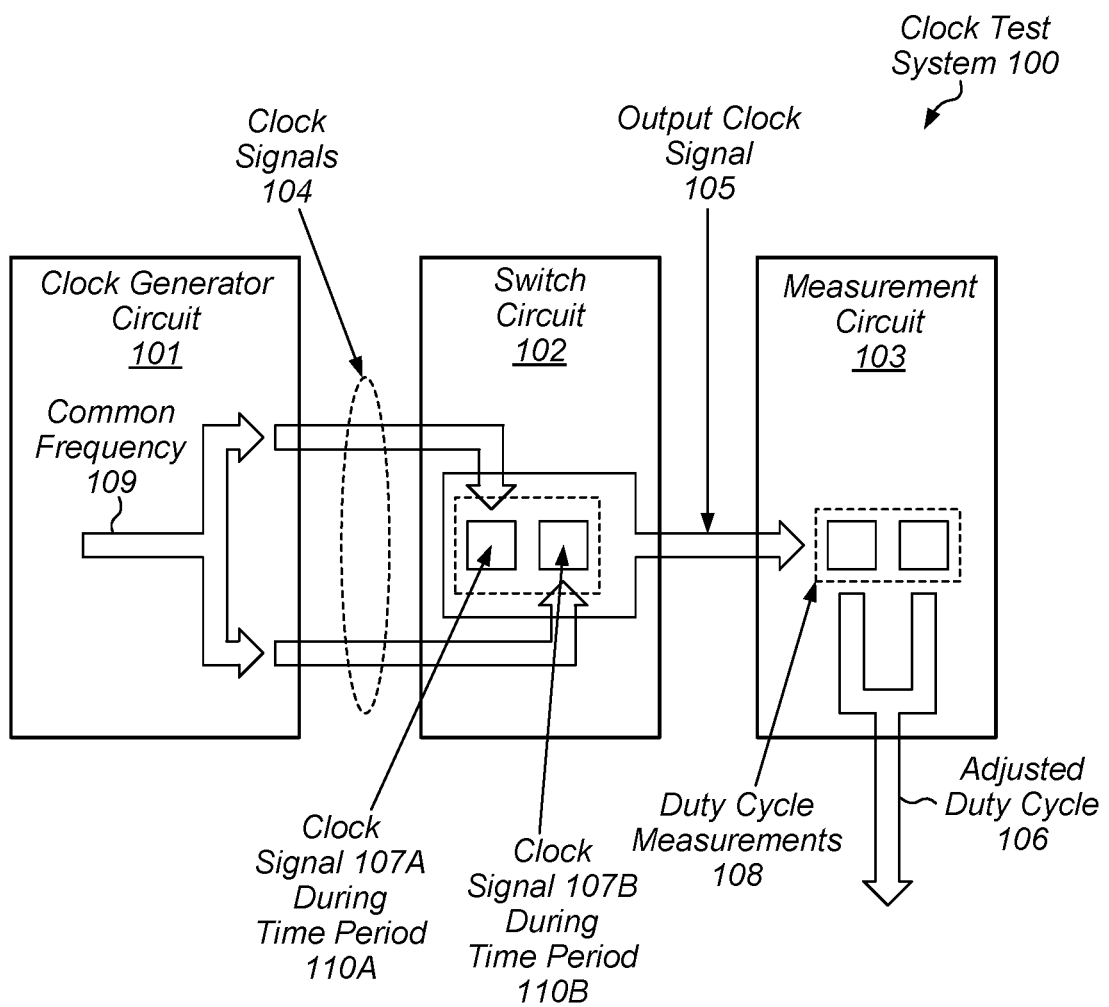
FIG. 1 is a block diagram of an embodiment of a clock test system.

Many computer systems employ clock generator circuits to generate various clock signals to be used as timing references within the computer system. Such clock signals may be used to activate latch or flip-flop circuits, as timing references to send and receive data, and the like. In some cases, different clock signals, each with different frequencies, may be used in different circuit blocks within the computer system.

In various computer systems, different methods may be employed to relay timing information to a circuit. In some cases, a single clock signal (referred to as a "single-ended clock") is used to encode the timing information. Alternatively, timing information may be encoded as the difference between the voltage level of two clock signals (referred to as a "differential clock"). In a differential clock, the two clock signals are inverses of one another.

Some circuit blocks within the computer system may use both the rising and falling edges as timing references. For example, a double-data rate memory circuit relies on both rising and falling clock edges to send and receive data. In circuits that use both clock edges, the duty cycle of the clock can affect the performance of the circuits. Duty-cycle distortion can result in a clock signal deviating from a desired duty cycle and can limit the performance of circuits such as processors, memories, and the like. As used herein, the "duty cycle" of a clock signal refers to a percentage of a period of the clock signal for which the value of the clock signal is a high logic value (or, alternatively, a low logic level). For circuit blocks that rely on both rising and falling edges, the ideal duty cycle is 50% in many cases. Duty-cycle distortion (DCD) refers to a variation in the duty cycle of a clock signal from its ideal value of 50%.

In order to improve clock generator circuit design to reduce duty-cycle distortion, various measurement techniques may be employed to determine the duty cycle of a clock signal. In some cases, such measurements are performed by routing the clock signal off-chip to a measurement circuit. Other solutions include on-chip measurement circuits. A common problem with both on-chip and off-chip duty cycle measurement techniques is random and deterministic noise sources that can reduce the accuracy of a duty cycle measurement, thereby limiting the precision of a correction or calibration scheme. Sources of such noise can include the measurement circuit itself, the clock distribution network from the clock generator circuit to the measurement circuit, the clock signal crossing different voltage domains on an integrated circuit, and the like.

The inventors have realized that when the duty cycle of a clock signal is measured over a sufficiently long period of time, the noise sources represent a static offset in the measurement of duty-cycle distortion. The inventors have further realized that, by being able to selectively couple different ones of a plurality of clock signals of a common frequency to a measurement circuit during different time periods, duty-cycle distortion measurements made during those time periods can be used to cancel the static offset. The embodiments illustrated in the drawings and described below provide techniques for measuring the duty-cycle distortion of a clock signal using different ones of a plurality of related clock signals. In some embodiments, clock flipping may be employed, in which a clock signal and its inverse are used at different times to measure the duty cycle of the clock. The different duty cycle measurements made during the different time periods are each distorted by the aforementioned static offsets. By combining (e.g., subtracting) the duty cycle measurements, the static offsets may be canceled leaving a relationship between the duty-cycle distortions of the duty cycle measurements. By canceling the static offsets in such a fashion, the accuracy of the duty-cycle distortion measurements may be improved, allowing for more precise calibration and correction of the duty cycle of the clock signal. In some embodiments, different portions of a differential clock signal may be employed to perform duty cycle measurements.

A block diagram of an embodiment of a clock test system is depicted in FIG. 1. As illustrated, clock test system 100 includes clock generator circuit 101, switch circuit 102, and measurement circuit 103.

Clock generator circuit 101 is configured to generate clock signals 104 with common frequency 109. In various embodiments, clock generator circuit 101 may be configured to generate one or more single-ended clock signals, multiple pairs of differential clock signals, or any suitable combination thereof. In various embodiments, clock generator circuit 101 may include oscillator circuits, phase-locked loop circuit, delay-locked loop circuits, or any other circuits suitable for generating clock signals.

Switch circuit 102 is configured to select, during time period 110A, clock signal 107A of clock signals 104 as output clock signal 105. Switch circuit 102 is further configured to select, during time period 110B, clock signal 110B of the clock signals 104 as output clock signal 105. As described below, output clock signal 105 may be a single-ended clock signal or a differential clock signal depending on the type of clock signals 104.

Measurement circuit 103 is configured to measure the duty cycle of output clock signal 105, at time periods 110A and 110B to generate respective ones of duty cycle measurements 108. In various embodiments, measurement circuit 103 is further configured to determine an adjusted duty cycle 106 of the output clock signal 105 using duty cycle measurements 108. By determining adjusted duty cycle 106 using duty cycle measurements 108, measurement circuit 103 may, in some embodiments, be configured to cancel a portion of duty cycle distortion in output clock signal 105, thereby increasing an accuracy of a duty cycle measurement of output clock signal 105.

In various embodiments, measurement circuit 103 may be configured to combine duty cycle measurements 108 to generate adjusted duty cycle 106. Each of duty cycle measurements 108 include multiple effects that contribute to the overall duty cycle. For example, the measured duty cycle during the first time period is given by Equation 1, where 0.5 corresponds to an ideal duty cycle of 50%, $DCD_1$ is the duty-cycle distortion associated with the first clock signal of clock signals 104, and $DCD_{path}$ is the duty-cycle distortion associated with the clock path between clock generator circuit 101 and measurement circuit 103.

$$DC_{meas1} = 0.5 + DCD_1 + DCD_{path} \quad (1)$$

In a similar fashion, the measured duty cycle during the second time period is given by Equation 2, wherein $DCD_2$ is the duty cycle associated with the second clock signal of clock signals 104. In various embodiments, the second clock signal is an inverted version of the first clock signal. As such, the duty-cycle distortion has the same magnitude, but the opposite sign.

$$DC_{meas2} = 0.5 - DCD_2 + DCD_{path} \quad (2)$$

To combine duty cycle measurements, measurement circuit 103 may be configured to subtract one duty cycle measurement form another. For example, by subtracting Equation 2 from Equation 1, the difference of the two duty cycle measurements can be determined as depicted in Equation 3.

$$DC_{diff} = DCD_{meas1} DCD_{meas2} = DCD_1 + DCD_2 \quad (3)$$

In subtracting the two duty cycle measurements, the duty-cycle distortion associated with the clock path is canceled out, leaving only the duty-cycle distortion values associated with the generation of the first and second clock signals. Since the second clock signal is a logical inversion of the first clock signal, their respective duty-cycle distortion values are opposites of each other as depicted in Equation 4.

$$DCD_1 = -DCD_2 \quad (4)$$

By substituting Equation 4 into Equation 3, the duty-cycle distortion associated with the second clock signal can be determined as shown in Equation 5. As seen in Equation 5, the duty-cycle distortion value associated with the second clock signal is only dependent on the two measured duty cycle values. With the cancelation of the duty-cycle distortion associated with the clock path, the accuracy of the of the duty-cycle distortion of the second clock signal may be improved, which may allow for more accurate calibration and correction of the generated clock signals. Since the duty-cycle distortion of the first clock signal is the opposite of the duty-cycle distortion of the second clock signal, both values can be determined using the duty cycle values measured during the first and second time periods. Once the duty-cycle distortion has been determined, adjusted duty cycle 106 can be determined using either duty cycle measurements 108 and the calculated duty-cycle distortion value from Equation 5.

$$DCD_2 = \frac{DC_{meas1} - DC_{meas2}}{2} \quad (5)$$

As noted above, switch circuit 102 is configured to select different ones of clock signals 104 at different periods of time. In various embodiments, clock signals 104 may include a variety of different clock signals. For example, clock signals 104 may include multiple single-ended clock signals, inverted versions of single-ended clock signals, differential clock signals, and the like. Depending which clock signal is to be tested, and what types of clock signals are available, different types of switch circuits may be employed to generate output clock signal 105 such that measurement circuit 103 can determine duty-cycle distortion as described above. The embodiments that follow in FIGS. 2-9, depict different circuits configured to generate, for different clock signal topologies, output clock signals for measurement.

Figure 2:
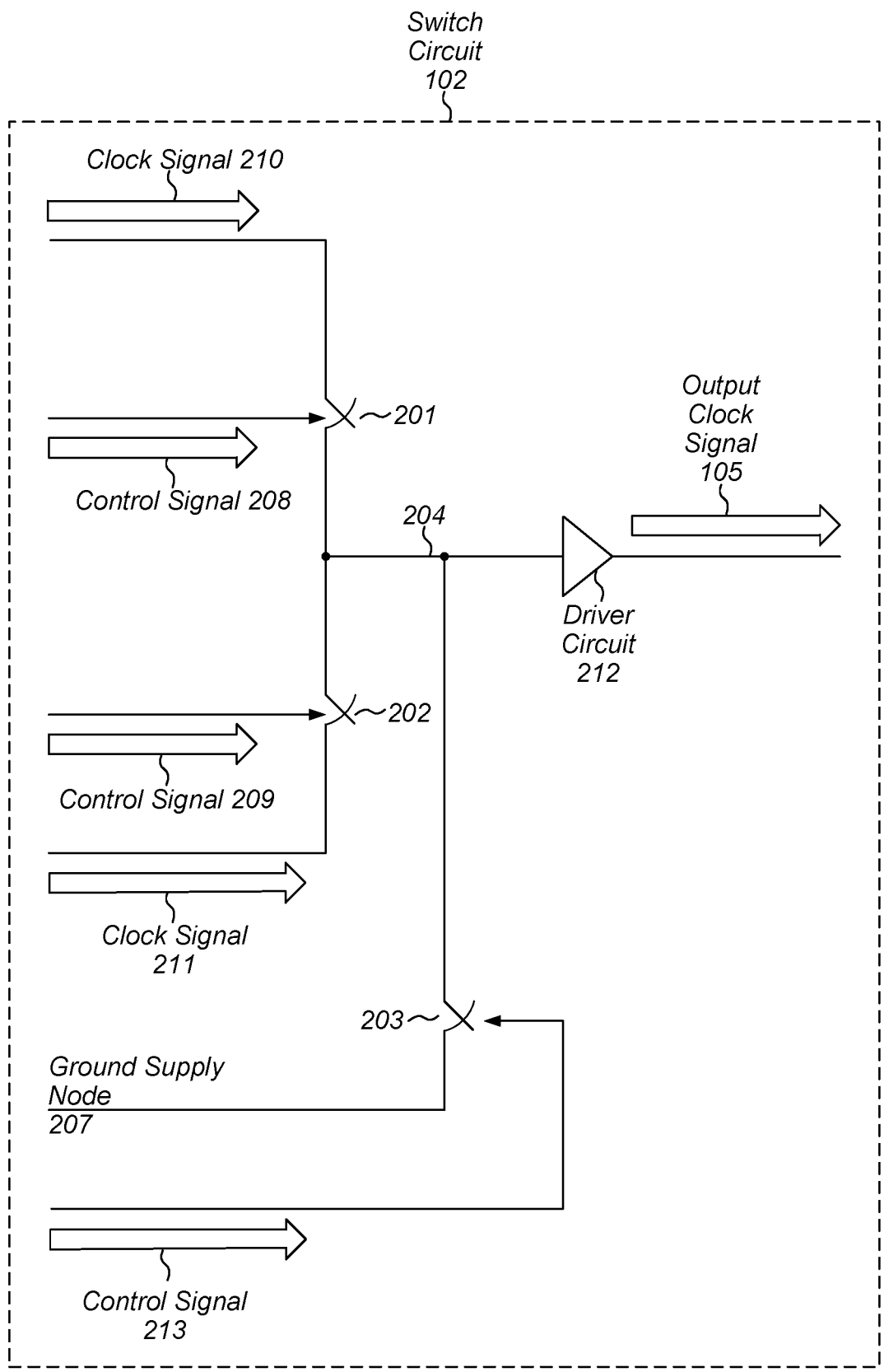
FIG. 2 illustrates an embodiment of a switch circuit

Turning to FIG. 2, a block diagram of an embodiment of switch circuit 102 is depicted. As illustrated, switch circuit 102 includes driver circuit 212 and switches 201-203.

In order to generate output clock signal 105, switch circuit 102 is configured to alternatively couple, for respective periods of time, either clock signal 210 or clock signal 211 to an input of driver circuit 212. Switch 201 is configured, in response to an assertion of control signal 208, to couple clock signal 210 to node 204 allowing clock signal 210 to propagate to an input of driver circuit 212. In a similar fashion, switch 202 is configured, in response to an assertion of control signal 209, to couple clock signal 211 to node 204 allowing clock signal 211 to propagate to the input of driver circuit 212. It is noted that in various embodiments, control signals 208 and 209 may be mutually exclusive to each other. It is further noted that respective periods of clock signals 210 and 211 may correspond to durations of respective ones of time periods 107.

As used and described herein, asserting a signal refers to setting the signal to a particular value that activates a device or circuit coupled to the signal. In a similar fashion, de-asserting the signal refers to setting the signal to a different value that de-activates the device or circuit coupled to the signal.

To reduce power consumption and noise, when clock test system 100 is not being used, switch circuit 102 is configured to set output clock signal 105 to a particular logic value. In various embodiments, output clock signal 105 is placed in a static state, where clock signal 210 and clock signal 211 are prevented from propagating to the input of driver circuit 212. In such a situation, control signals 208 and 209 are both de-asserted, opening switches 201 and 202. To prevent the input of driver circuit 212 from floating, switch 203 is configured, in response to an assertion of control signal 213, to couple ground node supply 207 to node 204, thereby setting output clock signal 105 to a high logic level. It is noted that, in other embodiments, the input of driver circuit 212 may be coupled to power supply node instead of ground supply 207, in order to keep the input of driver circuit 212 from floating.

Driver circuit 212 is configured to generate output clock signal 105 using a voltage level of node 204. It is noted that driver circuit 212 may be implemented as a buffer circuit, a non-inverting amplifier circuit, or any other suitable circuit configured to generate an output signal using an input signal, where a logical value of the output signal is the same as that of the input signal. Alternatively, driver circuit 212 may be implemented as an inverter or an inverting amplifier circuit. In such cases, additional logic circuit may be required in measurement circuit 103 to compensate for the difference in the logical polarity of output clock signal 105.

Switches 201-203 and driver circuit 212 may, in various embodiments, include multiple metal-oxide semiconductor field-effect transistor (MOSFETs), or any other suitable transconductance device. In some cases, a given one of switches 201-203 may include any suitable number of s n-channel MOSFETs and p-channel MOSFETs arranged to form a pass gate or other suitable structure.

Figure 3:
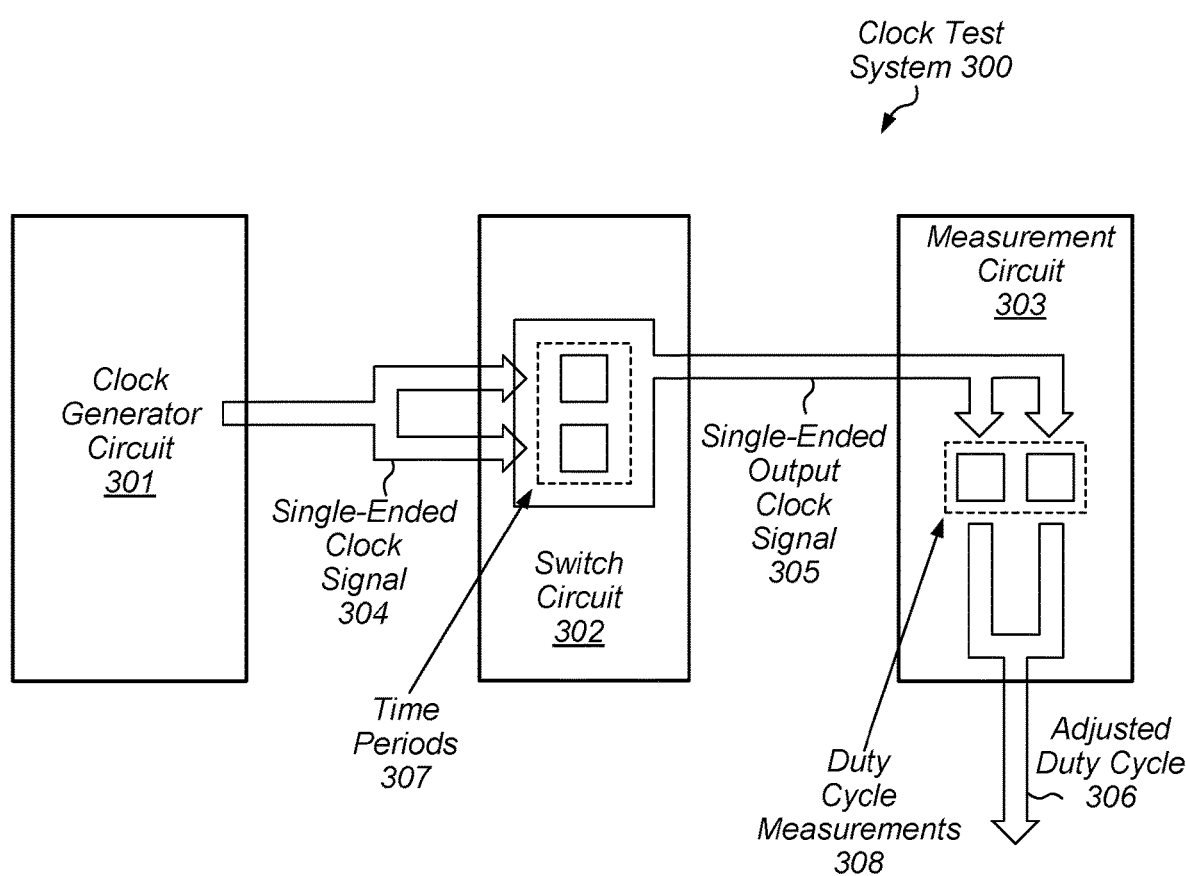
FIG. 3 illustrates a block diagram of another embodiment of a clock test system for single-ended input clock signals.

Turning to FIG. 3, a block diagram of another embodiment of a clock test system for single-ended input clock signals is depicted. As illustrated, clock test system 300 includes clock generator circuit 301, switch circuit 302, and measurement circuit 303.

Clock generator circuit 301 is configured to generate single-ended clock signal 304. In various embodiments, clock generator circuit 301 may be configured to generate one or more single-ended clock signals, multiple pairs of differential clock signals, or any suitable combination thereof.

Switch circuit 302 is configured to select, during a first time period of time periods 307, single-ended clock signal 304 as single-ended output clock signal 305. Switch circuit 302 is further configured to select, during a second time period of the time periods 307, a logical inverse of single-ended clock signal 304 as single-ended output clock signal 305.

Measurement circuit 303 is configured to measure the duty cycle of single-ended output clock signal 305, at different time periods of time periods 307, to generate respective ones of duty cycle measurements 308. In various embodiments, measurement circuit 303 is further configured to determine an adjusted duty cycle 306 of single-ended output clock signal 305 using duty cycle measurements 308. By determining adjusted duty cycle 306 using duty cycle measurements 308, measurement circuit 303 may, in some embodiments, be configured to cancel a portion of duty cycle distortion in single-ended output clock signal 305, thereby increasing an accuracy of a duty cycle measurement of single-ended output clock signal 305.

Figure 4:
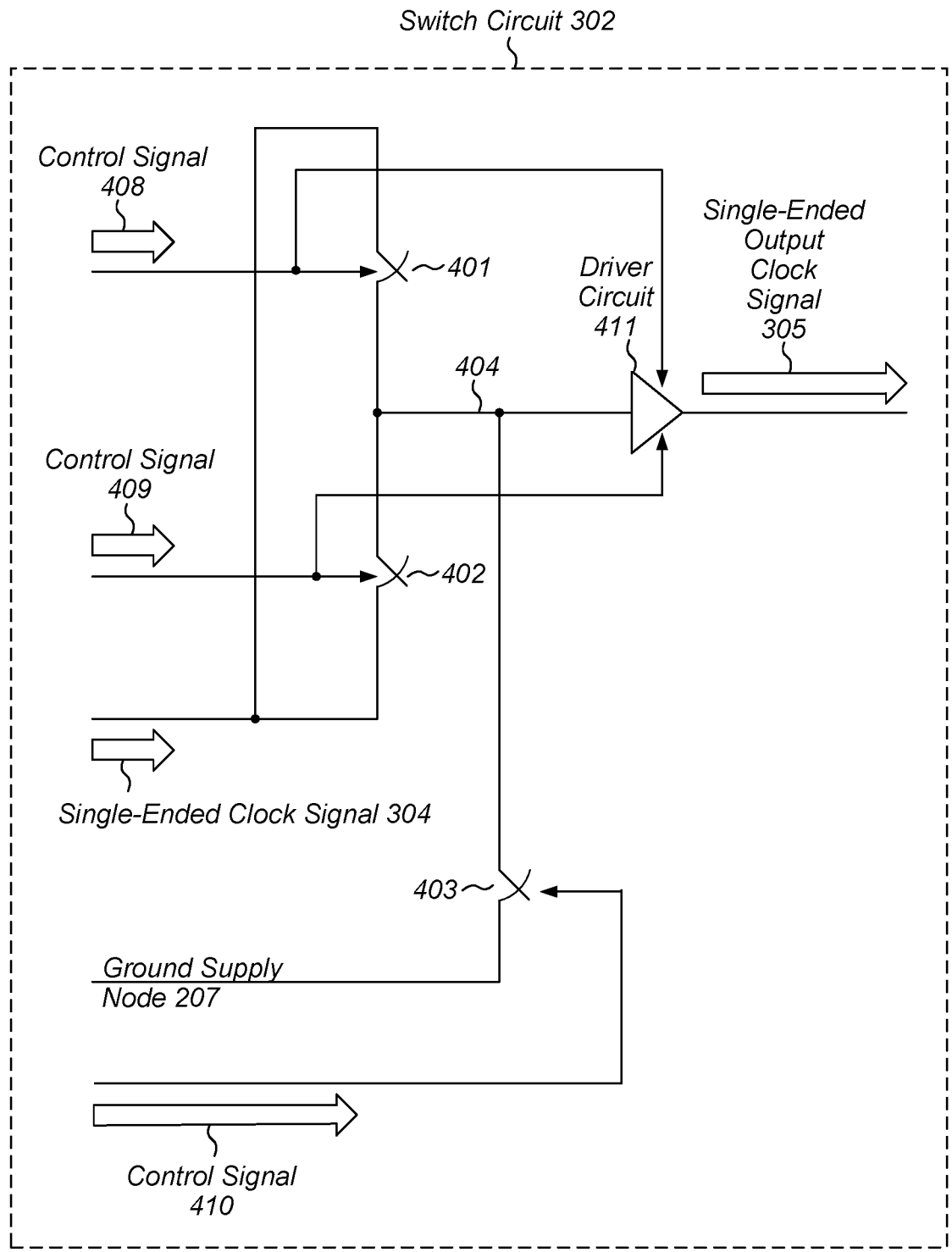
FIG. 4 illustrates an embodiment of a switch circuit for single-ended input clock signals, and single-ended clock output signals.

As noted above, switch circuit 302 is configured to select, at different times, either single-ended clock signal 304, or a logical inversion of single-ended clock signal 304. This selection may be accomplished using a variety of circuit techniques. A block diagram of a particular embodiment of switch circuit 302 is depicted in FIG. 4 As illustrated, switch circuit 302 includes driver circuit 411 and switches 401-403.

In order to generate single-ended output clock signal 305, switch circuit 302 is configured to alternatively couple, for respective periods of time, single ended clock signal 304, and a logical inversion of single-ended clock signal 304 to single-ended output clock signal 305.

Switch 401 is configured to selectively couple single-ended clock signal 304 to node 404 using control signal 408. For example, in response to an assertion of control signal 408, switch 401 couples single-ended clock signal 304 to node 404, allowing single-ended clock signal 304 to propagate to an input of driver circuit 411.

Switch 402 is configured to couple single-ended clock signal 304 to node 404 using control signal 409. For example, in response to an assertion of control signal 409, switch 402 couples single-ended clock signal 304 to node 404, allowing single-ended clock signal 304 to propagate to an input of driver circuit 411.

It is noted that switches 401 and 402 both are configured to couple single-ended clock signal 304 to node 404. By employing switches in this fashion, with minor changes to the connections to switch circuit 302, more than one input clock signal may be employed. Alternatively, in some embodiments, switches 401 and 402 may be omitted, and single-ended clock signal 304 may be directly input to driver circuit 411.

Driver circuit 411 is configured to generate single-ended output clock signal 305 using control signals 408 and 409, and a voltage level of node 404. As described below, driver circuit 411 is configured, based on respective values of control signals 408 and 409, to either buffer the voltage level of node 404, or logically invert the voltage level of node 404, in order to generate single-ended output clock signal 305. In some cases, the voltage level of node 404 may correspond to single-ended clock signal 304 or, as described below, the voltage level of node 404 may be at or near ground potential during certain operational modes.

It is noted that, in various embodiments, control signals 408 and 409 may be mutually exclusive to each other, i.e., control signals 408 and 409 cannot both be active at the same time. It is further noted that periods of single-ended clock signal 304 may correspond to durations of respective ones of time periods 307.

In various embodiments, in order to reduce power consumption and noise, when clock test system 300 is not being used, single-ended output clock signal 305 is placed in a static state, where single-ended clock signal 304 is prevented from propagating to single-ended output clock signal 305. In such a situation, control signals 408 and 409 are both de-asserted, opening switches 401 and 402, and disabling driver circuit 411. To prevent node 404 from floating, switch 403 is configured, in response to an assertion of control signal 410, to couple ground supply node 207 to node 404, thereby setting node 404 to a low logic level.

Switches 401, 402, and 403 and driver circuit 411, may, in various embodiments, include multiple metal-oxide semiconductor field-effect transistor (MOSFETs), or any other suitable transconductance device. In some cases, a given one of switches 401, 402, and 403, and driver circuit 411 may include one or more n-channel MOSFETs and one or more p-channel MOSFETs arranged to form pass gates, inverters, or other suitable structures.

Figure 5:
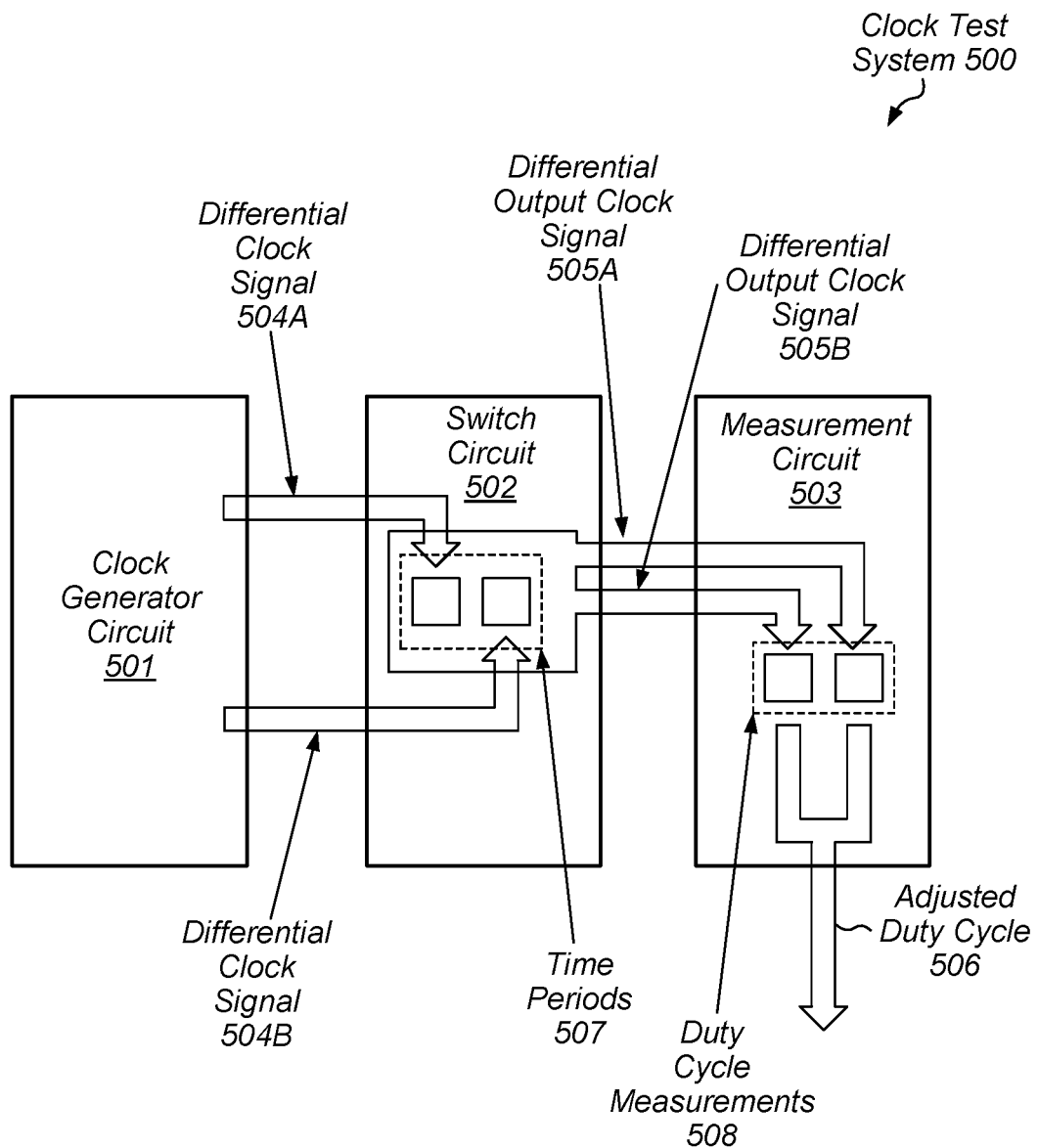
FIG. 5 illustrates a block diagram of an embodiment of a clock test system for differential clock input signals.

FIG. 5 illustrates a block diagram of another embodiment of a clock test system for differential input clock signals. As illustrated, clock test system 500 includes clock generator circuit 501, switch circuit 502, and measurement circuit 503.

Clock generator circuit 501 is configured to generate differential clock signals 504A and 504B. In various embodiments, clock generator circuit 501 may be configured to generate one or more single-ended clock signals, multiple pairs of differential clock signals, or any suitable combination thereof.

Switch circuit 502 is configured to select, during a first time period of time periods 507, differential clock signal 504A as differential output clock signal 505A, and is further configured to select, during a first period of time periods 507, differential clock signal 504B as differential output clock signal 505B. Switch circuit 502 is further configured to select, during a second time period of the time periods 307, differential clock signal 504A as differential output clock signal 505B, and is further configured to select, during a second time period of the time periods 307, differential clock signal 505B as differential output clock signal 505A.

Measurement circuit 503 is configured to measure the duty cycle of differential output clock signals 505A and 505B, at different time periods of time periods 307, to generate respective ones of duty cycle measurements 508. In various embodiments, measurement circuit 503 is further configured to determine an adjusted duty cycle 506 of differential output clock signals 505A and B, using duty cycle measurements 508. By determining adjusted duty cycle 506 using duty cycle measurements 508, measurement circuit 503 may, in some embodiments, be configured to cancel a portion of duty cycle distortion in differential output clock signals 505A and B, thereby increasing an accuracy of a duty cycle measurement of differential output clock signals 505A and 505B.

Figure 6:
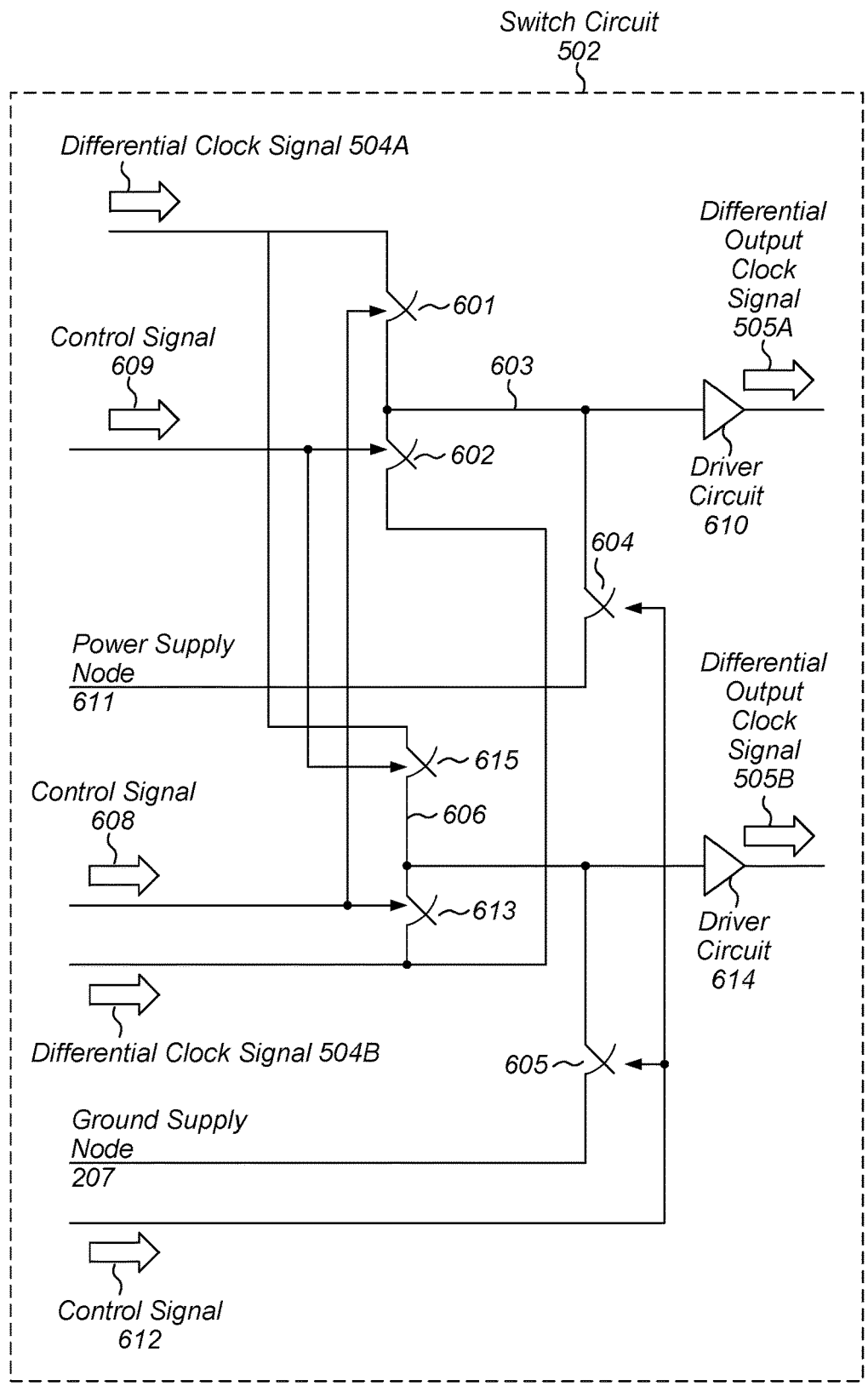
FIG. 6 illustrates an embodiment of a switch circuit for differential clock input signals and differential clock output signals.

As noted above, switch circuit 502 is configured to select, at different times, either differential clock signal 504A or differential clock signal 504B as differential output clock signal 505A, and is further configured to select, at different times, either differential clock signal 504A or differential clock signal 504B as differential output clock signal 505B. This may be accomplished using a variety of circuit techniques. A block diagram of a particular embodiment of switch circuit 502 is depicted in FIG. 6. As illustrated, switch circuit 502 includes driver circuit 610, driver circuit 614, and switches 601, 602, 604, 605, 613, and 615.

In order to generate differential output clock signal 505A, switch circuit 502 is configured to alternatively couple, for respective periods of time, differential clock signal 504A, and differential clock signal 504B, to differential output clock signal 505A. In order to generate differential output clock signal 505B, switch circuit 502 is further configured to alternatively couple, for respective periods of time, differential clock signal 504A, and differential clock 504B, to differential output clock signal 505B.

Switch 601 is configured to selectively couple differential clock signal 504A to node 603 using control signal 608. For example, in response to an assertion of control signal 608, switch 601 couples differential clock signal 504A to node 603, allowing differential clock signal 504A to propagate to an input of driver circuit 610.

Switch 602 is configured to selectively couple differential clock signal 504B to node 603 using control signal 609. For example, in response to an assertion of control signal 609, switch 602 couples differential clock signal 504B to node 603, allowing differential clock signal 504B to propagate to an input of driver circuit 610.

Switch 613 is configured to selectively couple differential clock signal 504B to node 606 using control signal 608. For example, in response to an assertion of control signal 608, switch 613 couples differential clock signal 504B to node 606, allowing differential clock signal 504B to propagate to an input of driver circuit 614.

Switch 615 is configured to selectively couple differential clock signal 504A to node 606 using control signal 609. For example, in response to an assertion of control signal 609, switch 615 couples differential clock signal 504A to node 606, allowing differential clock signal 504A to propagate to an input of driver circuit 614.

It is noted that, in various embodiments, control signals 608 and 609 may be mutually exclusive to each other. It is further noted that periods of differential clock signal 504A and differential clock signal 505B may correspond to durations of respective ones of time periods 507.

To reduce power consumption and noise, when clock test system 500 is not being used, switch circuit 502 may be configured to set differential output clock signal 505A and differential output clock signal 505B to particular logic values. In various embodiments, differential clock signals 505A and 505B are prevented from propagating to differential output clock signal 505A and 505B. In such a situation, control signals 608 and 609 are both de-asserted, opening switches 601, 602, 613, and 615.

To prevent the input of driver circuit 610 from floating, switch 604 is configured, in response to an assertion of control signal 612, to couple power supply node 611 to node 603, thereby setting differential output clock signal 505A to a high logic level. To prevent the input of driver circuit 614 from floating, switch 605 is configured, in response to an assertion of control signal 612, to couple ground supply node 207 to node 603, thereby setting differential output clock signal 505B to a low logic level.

Driver circuit 610 is configured to generate differential output clock signal 505A using a voltage level of node 603. Driver circuit 614 is configured to generate differential output clock signal 505B using a voltage level of node 606. It is noted that driver circuits 610 and 614 may be embodiments of a buffer circuit, a non-inverting amplifier circuit, or any other suitable circuit, that generates an output signal using an input signal, where the logical polarity of the output signal is the same as an input circuit.

Switches 601, 602, 604, 605, 613, and 615, may, in various embodiments, include multiple metal-oxide semiconductor field-effect transistor (MOSFETs), or any other suitable transconductance device. For example, a given one switches 601, 602, 604, 605, 613, and 615 may include one or more n-channel MOSFETs and one or more p-channel MOSFETs arranged to form a pass gate or other suitable circuit structure.

Figure 7:
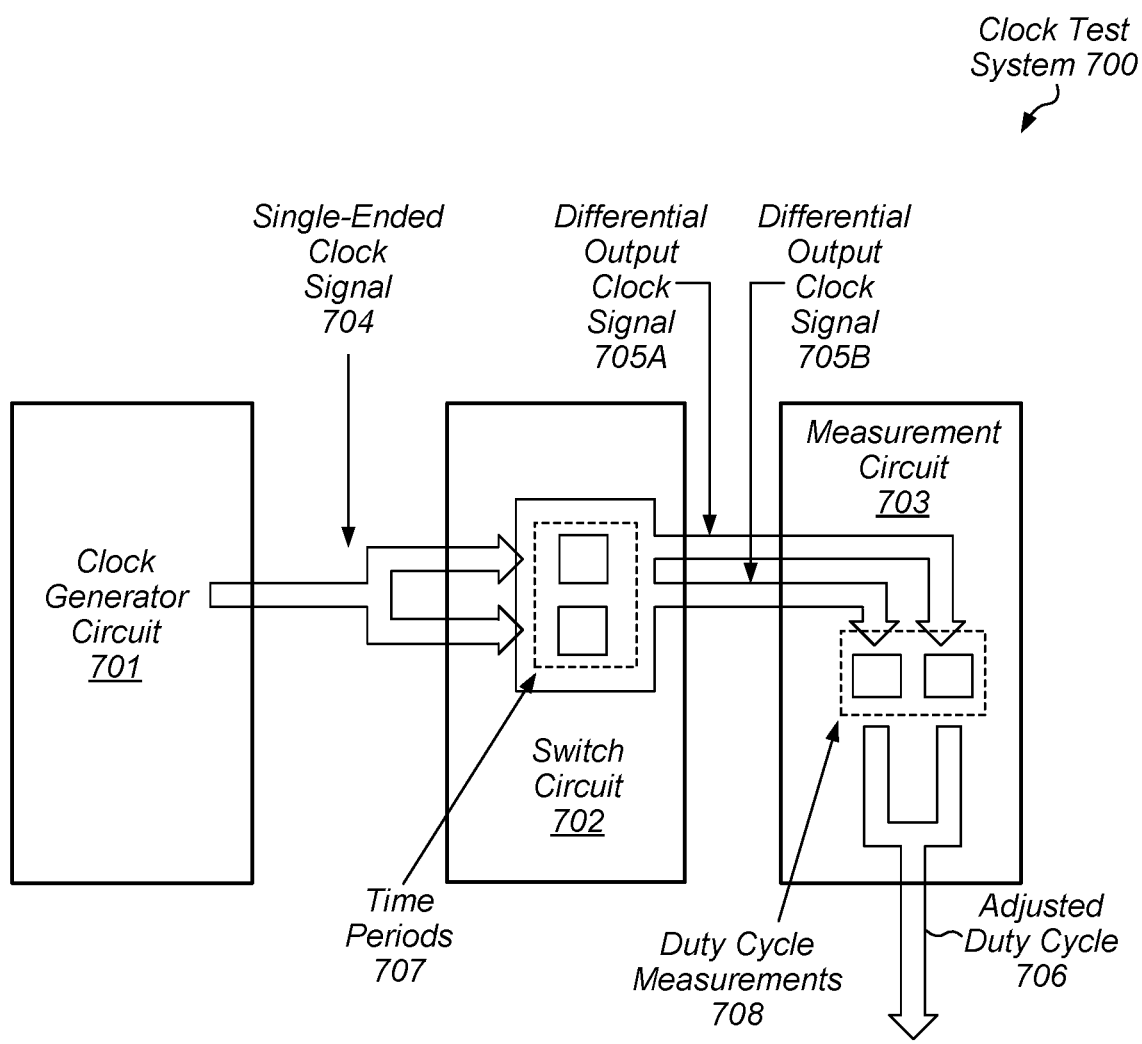
FIG. 7 illustrates a block diagram of an embodiment of a clock test system for single-ended clock input signals.

FIG. 7 illustrates a block diagram of another embodiment of a clock test system for single-ended clock signals. As illustrated, clock test system 700 includes clock generator circuit 701, switch circuit 702, and measurement circuit 703.

Clock generator circuit 701 is configured to generate single-ended clock signal 704. In various embodiments, clock generator circuit 701 may be configured to generate one or more single-ended clock signals, multiple pairs of differential clock signals, or any suitable combination thereof.

Switch circuit 702 is configured to select, during a first time period of time periods 707, single-ended clock signal 704 as differential output clock signal 705A, and is further configured to select, during a first period of time periods 707, a logical inverse of single-ended clock signal 404 as differential output clock signal 705B. Switch circuit 702 is further configured to select, during a second time period of the time periods 707, a logical inverse of clock signal 704 as differential output clock signal 705A, and is further configured to select, during a second time period of the time periods 707, single-ended clock signal 704 as differential output clock signal 705B.

Measurement circuit 703 is configured to measure the duty cycle of differential output clock signals 705A and 705B, at different time periods of time periods 707, to generate respective ones of duty cycle measurements 708. In various embodiments, measurement circuit 703 is further configured to determine an adjusted duty cycle 706 of differential output clock signals 705A and 705B, using duty cycle measurements 708. By determining adjusted duty cycle 706 using duty cycle measurements 708, measurement circuit 703 may, in some embodiments, be configured to cancel a portion of duty cycle distortion in differential output clock signals 705A and 705B, thereby increasing an accuracy of a duty cycle measurement of differential output clock signals 705A and 705B.

As noted above, switch circuit 702 is configured to select, at different times, either single-ended clock signal 704, or a logical inverse of single-ended clock signal 704, as differential output clock signal 705A, and is further configured to select, at different times, either a logical inverse of single-ended clock 704, or single-ended clock signal 704, as differential output clock signal 705B. This may be accomplished using a variety of circuit techniques.

Figure 8:
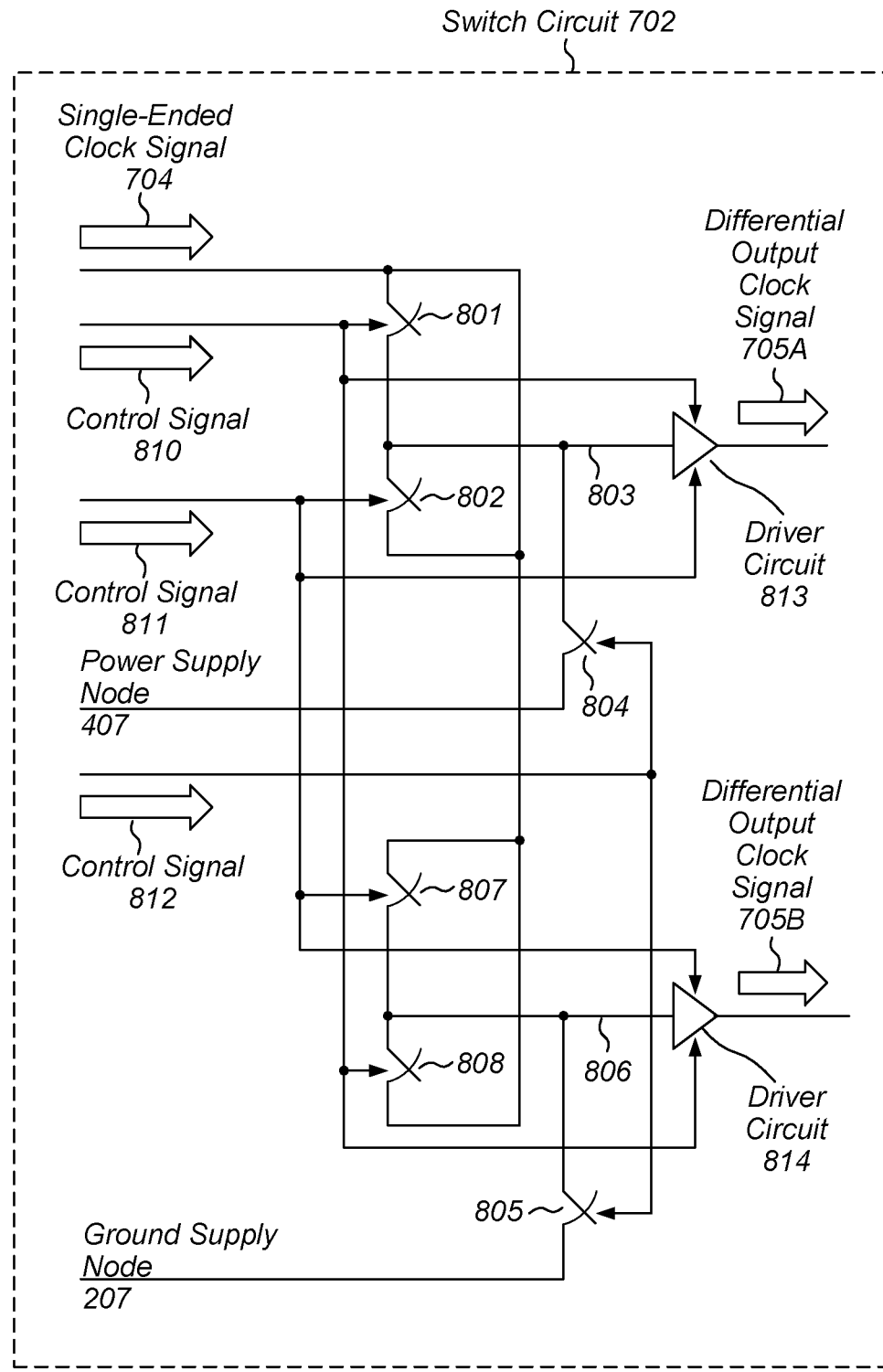
FIG. 8 illustrates an embodiment of a switch circuit for single-ended clock input signals and differential clock output signals.

A block diagram of a particular embodiment of switch circuit 702 is depicted in FIG. 8. As illustrated, switch circuit 702 includes driver circuit 610, driver circuit 614, and switches 801, 802, 804, 805, 807, and 808.

In order to generate differential output clock signal 705A. and 705B, switch circuit 702 is configured to alternatively couple, for respective periods of time, single-ended clock signal 704, and a logical inverse of single-ended clock signal 704, to differential output clock signals 705A and 705B.

Switch 801 is configured to selectively couple single-ended clock signal 704 to node 803 using control signal 810. For example, in response to an assertion of control signal 810, switch 801 couples single-ended clock signal 704 to node 803, allowing single-clock signal 704 to propagate to an input of driver circuit 813.

Switch 802 is configured to selectively couple single-ended clock signal 704 to node 803 using control signal 811. For example, in response to an assertion of control signal 811, switch 802 couples single-ended clock signal 704 to node 803, allowing single-ended clock signal 704 to propagate to an input of driver circuit 813.

It is noted that switches 801 and 802 both couple single-ended clock signal 704 to node 803. By employing switches in this fashion, with minor changes to the connections to switch circuit 702, more than one input clock signal may be employed. Alternatively, in some embodiments, switches 801 and 802 may be omitted, and single-ended clock signal 704 may be directly input to driver circuit 813.

Driver circuit 813 is configured to generate differential output clock signal 705A using control signals 810 and 811, and a voltage level of node 803. As described below, driver circuit 813 is configured, based on respective values of control signals 810 and 811, to either buffer the voltage level of node 803, or logically invert the voltage level of node 803, in order to generate differential output clock signal 705A. In some cases, the voltage level of node 803 may correspond to single-ended clock signal 704 or, as described below, the voltage level of node 803 may be at or near ground potential during certain operational modes.

Switch 807 is configured to selectively couple single-ended clock signal 704 to node 806 using control signal 811. For example, in response to an assertion of control signal 811, switch 807 couples single-ended clock signal 704 to node 806, allowing single-ended clock signal 704 to propagate to an input of driver circuit 814.

Switch 808 is configured to selectively couple single-ended clock signal 704 to node 806 using control signal 810. For example, in response to an assertion of control signal 810, switch 808 couples single-ended clock signal 704 to node 806, allowing single-ended clock signal 704 to propagate to an input of driver circuit 814.

It is noted that switches 807 and 808 both couple single-ended clock signal 704 to node 806. By employing switches in this fashion, with minor changes to the connections to switch circuit 702, more than one input clock signal may be employed. Alternatively, in some embodiments, switches 807 and 808 may be omitted, and single-ended clock signal 704 may be directly input to driver circuit 814.

Driver circuit 814 is configured to generate differential output clock signal 705B using control signals 810 and 811, and a voltage level of node 806. As described below, driver circuit 814 is configured, based on respective values of control signals 810 and 811, to either buffer the voltage level of node 806, or logically invert the voltage level of node 806, in order to generate differential output clock signal 705B. In some cases, the voltage level of node 806 may correspond to single-ended clock signal 704 or, as described below, the voltage level of node 806 may be at or near ground potential during certain operational modes. It is noted that driver circuit 814 is configured to operate in an inverse fashion from driver circuit 813. For example, when driver circuit 813 is buffering the voltage level of node 806 to generate differential output clock signal 705A, driver circuit 814 is inverting the voltage level of node 806 to generate differential output clock signal 705B.

It is noted that, in various embodiments, control signals 810 and 811 may be mutually exclusive to each other. It is further noted that periods of single-ended clock signal 704 may correspond to durations of respective ones of time periods 707.

In various embodiments, in order to reduce power consumption and noise, when clock test system 700 is not being used, differential output clock signals 705A and 705B are placed in a static state, where single-ended clock signal 704 is prevented from propagating to differential output clock signals 705A and 705B. In such a situation, control signals 810 and 811 are both de-asserted, opening switches 801, 802, 807, 808 and disabling driver circuit 814.

To prevent node 803 from floating, switch 804 is configured, in response to an assertion of control signal 812, to couple power supply node 407 to node 803, thereby setting node 803 to a high logic level. To prevent node 806 from floating, switch 805 is configured, in response to an assertion of control signal 812, to couple ground supply node 207 to node 806, thereby setting node 806 to a low logic level.

Switches 801, 802, 807, 808, 804, and 805 may, in various embodiments, include multiple metal-oxide semiconductor field-effect transistor (MOSFETs), or any other suitable transconductance device. In some cases, a given one of switches 801, 802, 807, 808, 804, 805 may include one or more n-channel MOSFETs and one or more p-channel MOSFETs arranged to form a pass gate, or other suitable circuit structure.

Figure 9:
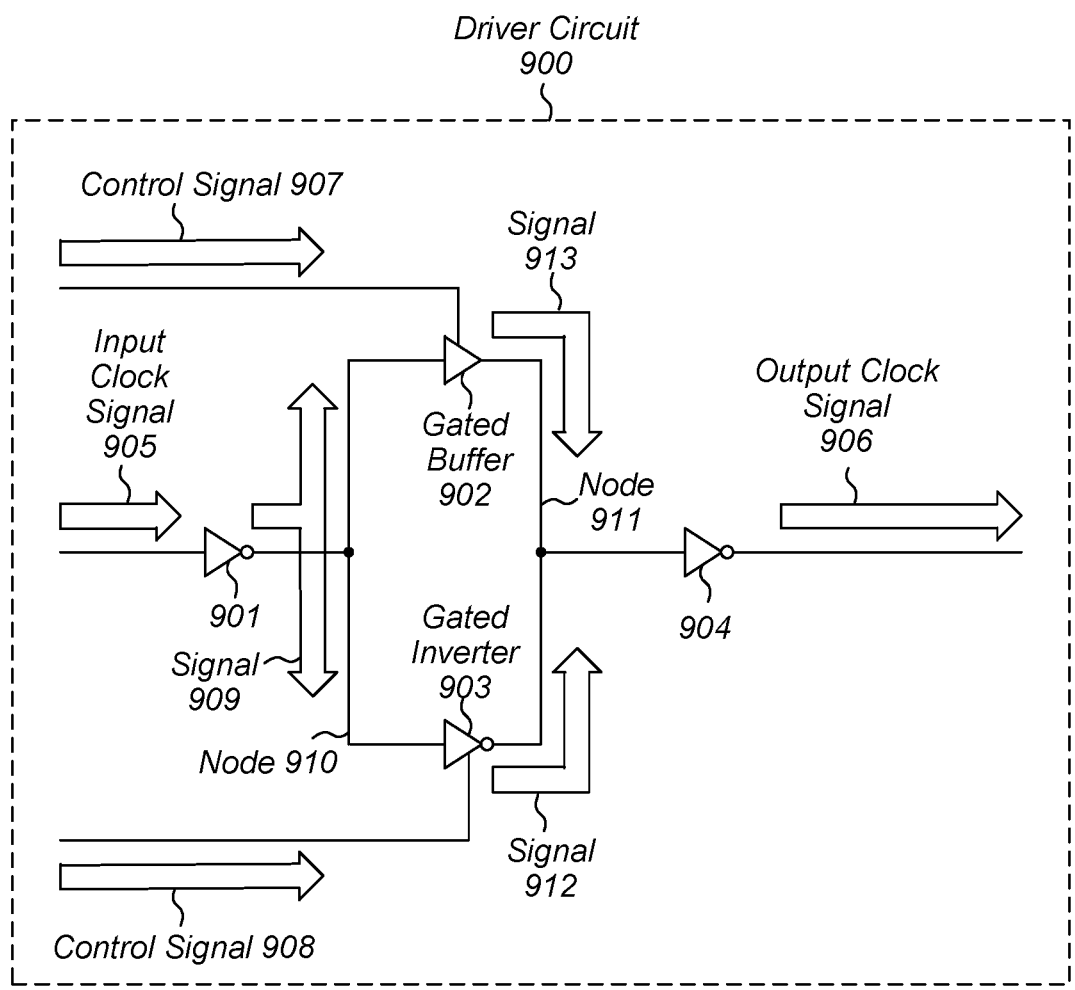
FIG. 9 illustrates an embodiment of a driver circuit.

Various circuit topologies may be used to implement a driver circuit (e.g., driver circuits 411, 813, and 814). An embodiment of a driver circuit that employs one such topology is depicted in FIG. 9. As illustrated, driver circuit 900 contains inverters 901 and 904, gated inverter 903, and gated buffer 902.

Inverter 901 is configured to generate signal 909 on node 910 using input clock signal 905. In various embodiments, signal 909 may be a logical inversion of input clock signal 905. Inverter 901 may, in some embodiments, be an embodiment of an inverting amplifier other suitable circuit configured to generate an output signal that is a logical inverter of an input signal.

Gated buffer 902 is configured to generate, based on control signal 907, signal 913 on node 911 using signal 909. For example, in response to an assertion of control signal 907, gated buffer 902 is configured to generate signal 913 such that signal 913 is a buffered version of signal 909. Alternatively, when control signal 907 is de-asserted, gated buffer 902 may enter a high-impedance state, where its connection to node 911 is an impedance that is sufficiently high (possible on the order of tera-ohms) so as to not load node 911. In various embodiments, gated buffer 902 may be implemented as a non-inverting amplifier or other suitable amplifier circuit.

Gated inverter 903 is configured to generate, based on control signal 908, signal 912 on node 911 using signal 909. For example, in response to an assertion of control signal 908, gated inverter 903 is configured to generate signal 912 such that signal 912 is a logical inversion of signal 909. Alternatively, when control signal 908 is de-asserted, gated inverter 903 may enter a high-impedance state, in which its output impedance approximates an open circuit.

It is noted that control signal 907 and 910 may be mutually exclusive, such that only one of gated buffer 902 and gated inverter 903 is active at any particular time. As such, only one of signal 913 or signal 912 may be propagating to the input of inverter 904 via node 911 at any given time. By alternating the activation of gated buffer 902 and gated inverter 903, driver circuit 900 is able to create output clock signal 906 with either the same, or an inverted, logical polarity as input clock signal 905.

Inverter 904 is configured to generate output clock signal using either of signal 913 or signal 912. When gated buffer 902 is active and gated inverter 903 is inactive, output clock signal 906, which is a logical inversion version of signal 913. Alternatively, when gated buffer 902 is inactive and gated inverter 903 is active, output clock signal 906, which is logical inversion version of signal 912.

Figure 10:
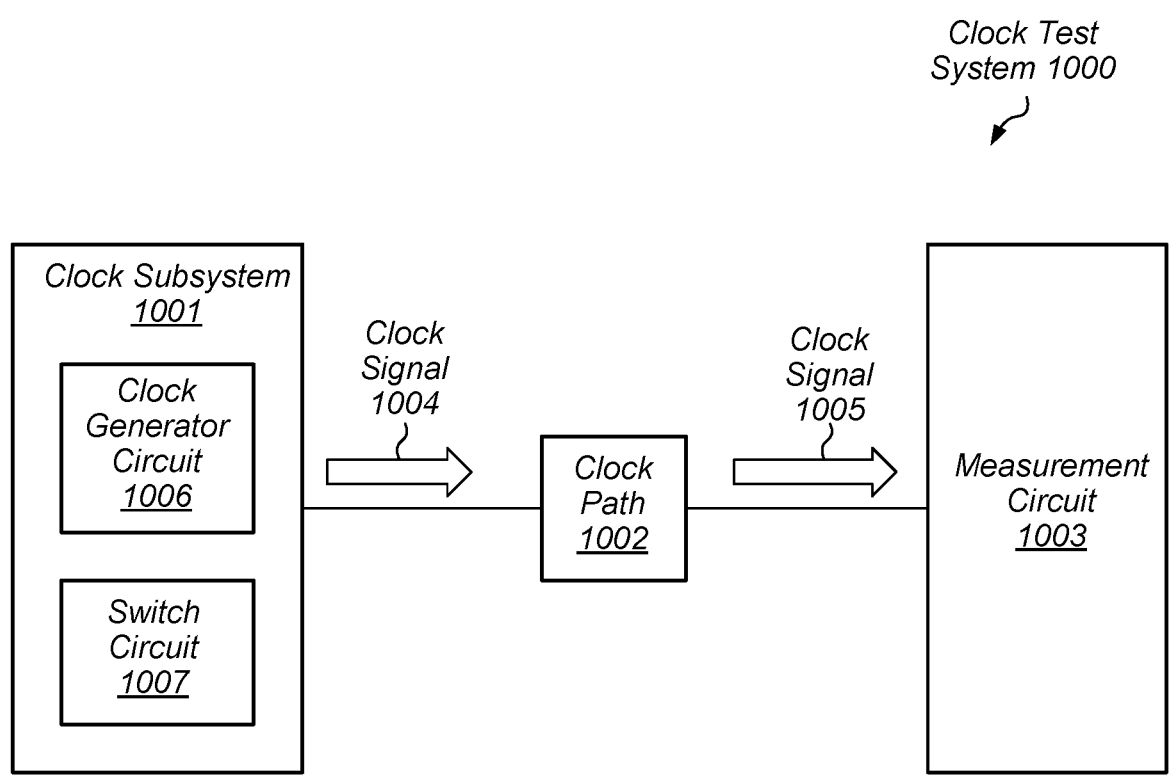
FIG. 10 illustrates a block diagram of another embodiment of a clock test system with a clock path.

Turning to FIG. 10, another embodiment of a clock test system is depicted. As illustrated, clock test system 1000 includes clock subsystem 1001, measurement circuit 1003, and clock path 1002.

Clock subsystem 1001 includes clock generator circuit 1006 and switch circuit 1007, and is configured to generate clock signal 104. In various embodiments, clock signal 1004 may include one or more single-ended clock signals, multiple pairs of differential clock signals, or any suitable combination thereof. Clock generator circuit 1006 may, in some embodiments correspond to clock generator circuit 101, clock generator circuit 301, clock generator circuit 501, clock generator circuit 701. Switch circuit 1007 may, in various embodiments, correspond to switch circuit 102, switch circuit 302, switch circuit 502, or switch circuit 702.

Measurement circuit 1003 is configured to measure a duty cycle of clock signal 1005. In various embodiments, measurement circuit 1003 may correspond to measurement circuit 103, measurement circuit 303, measurement circuit 503, or measurement circuit 704.

Clock path 1002 is coupled between clock subsystem 1001 and measurement circuit 1003, and is configured to generate clock signal 1005 using clock signal 1004. As described below, clock path 1002 may, in various embodiments, may include components such as logic circuits, as well as the interconnect between components. In some cases, measurement circuit 1003 may be on a separate integrated circuit from clock subsystem 1001, in which case, clock path 1002 may also include circuits related to driving clock signals 1004 off-chip, interconnect between an integrated circuit including clock subsystem 1001 and measurement circuit 1003.

Various sources of noise may be generated by clock path 1002, including various types of device noise, and interconnect noise, which may reduce the accuracy of the clock duty cycle measurements made in measurement circuit 1003, and as depicted in FIGS. 1, 3, 5, and 7.

As explained above, when the duty cycle of a clock signal is measured over a sufficiently long period of time, the noise sources represent a static offset in the measurement of duty cycle distortion. By flipping the polarity of the clock signal during different time periods as depicted in FIGS. 2, 4, 6, and 8, duty cycle distortion measurements made during those time periods can be used to cancel the static effect, as explained in more detail above.

Figure 11:
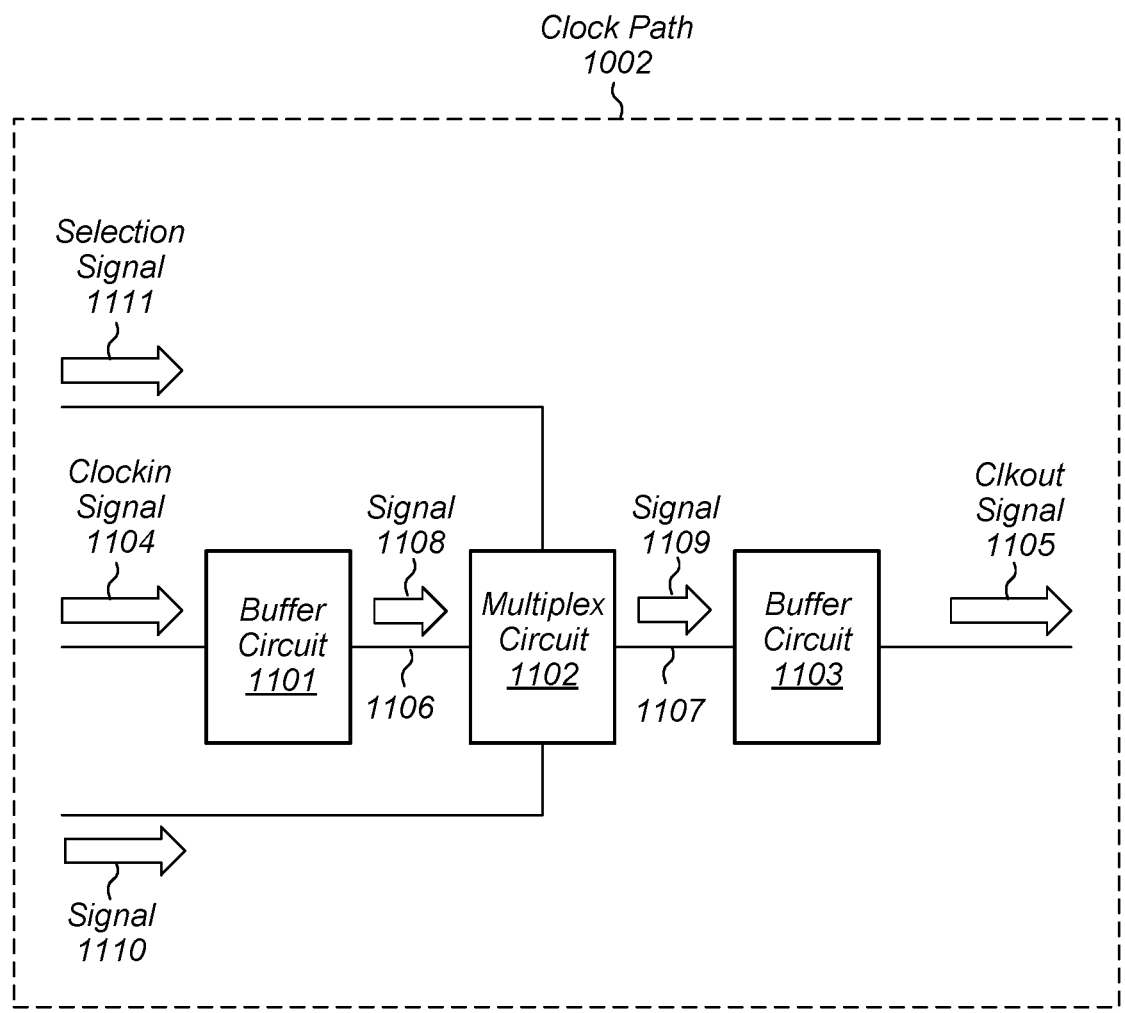
FIG. 11 illustrates an embodiment of a clock path circuit.

An embodiment of clock path 1002 is depicted in FIG. 11. As illustrated, clock path 1002 includes buffer circuit 1101, multiplex circuit 1102, and buffer circuit 1103.

Buffer circuit 1101 is configured to generate, using clockin signal 1104, signal 1108 on node 1106. In various embodiments, signal 1108 is a buffered version of clockin signal 1104. In some embodiments, buffer circuit 1101 may be an embodiment of a non-inverting amplifier. In some cases, buffer circuit 1101 may include multiple inverters or other suitable logic gates.

Multiplex circuit 1102 is configured to selectively couple, based on selection signal 1111, either signal 1108 or signal 1110 to node 1107 to generate signal 1109. In various embodiments, signal 1110 may be another clock or timing signal. In some embodiments, multiplex circuit 1102 may include multiple logic gates configured to implement a selection function. Alternatively, multiplex circuit 1102 may include multiple tri-state driver circuits coupled together in a wired-OR fashion.

Buffer circuit 1103 is configured to generate clkout signal 1105 using signal 1109. In various embodiments, is configured to generate clkout signal 1105 such that clkout signal 1105 is a buffered version of signal 1109, having the same logical polarity as signal 1109. In some embodiments, buffer circuit 1103 may be an embodiment of a non-inverting amplifier. In some cases, buffer circuit 1103 may include multiple inverters or other suitable logic gates.

It is noted that although only three logic circuits are depicted as being included in clock path 1002, in other embodiments, any suitable number of logic circuits may be included. In some cases, clock path 1002 may also include parasitic circuit elements resulting from wiring interconnect between buffer circuit 1101, multiplex circuit 1102, and buffer circuit 1103.

Figure 12:
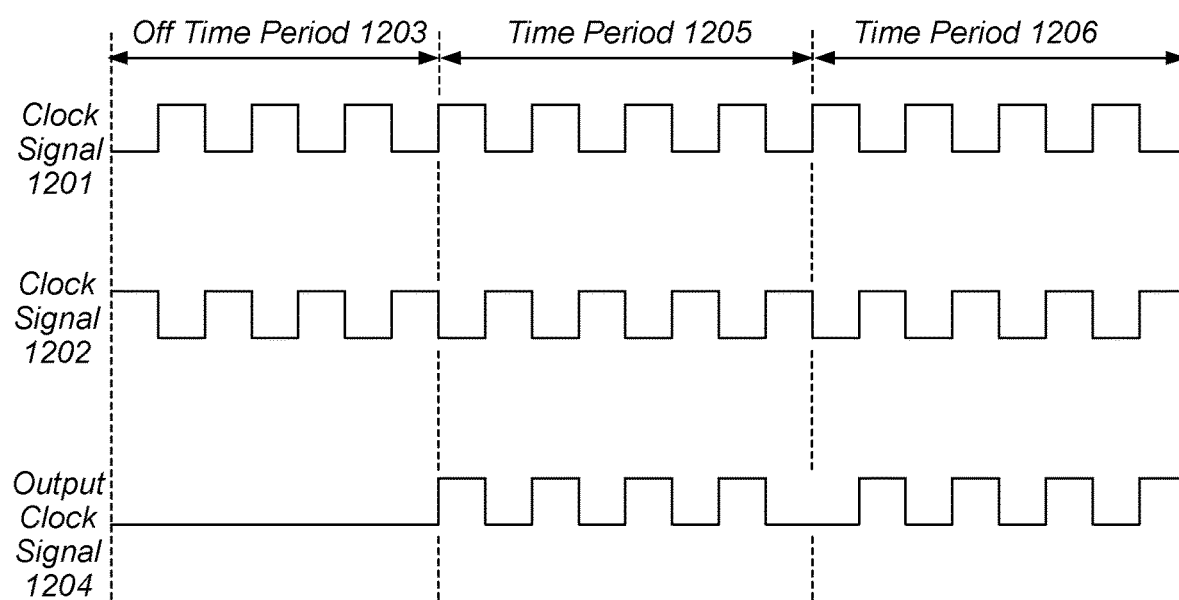
FIG. 12 illustrates example waveforms associated with operating a clock test system.

Turning to FIG. 12, example waveforms associated with the operation of a clock test system (e.g., clock test system 100) are illustrated. In various embodiments, clock signal 1201 and 1202 may correspond to respective ones of clock signals 104, and output clock signal 1204 may correspond to output clock signal 105. As illustrated, clock signal 1202 has an opposite logical polarity of clock signal 1202. It is noted that although clock signals 1201, 1202, and output clock signal 1204 are depicted as single-ended clock signals, in other embodiments, clock signals 1201 and 1202, and output clock signals 1204 may be differential clock signals.

During off time 1203, output clock signal 1204 is held at a low logic level while clock signals 1201 and 1202 remain active. In various embodiments, off time 1203 may correspond to a period of time during which clock test system is not being used and is inactive.

During time period 1205, clock signal 1201 is selected as output clock signal 1204. At the end of time period 1205, clock signal 1202 is selected as output clock signal 1204 for the duration of time period 1206. resulting in a change in the logical polarity of output clock signal 1204. As described above, the duty cycle of output clock signal 1204 is measured during time period 1205 to generate a first duty cycle measurement, and is measured during time period 1206 to generate a second duty cycle measurement.

As described above, the first and second cycle duty cycle measurements may be combined to cancel out duty-cycle distortion associated with a clock path through which output clock signal 1204 propagates. By canceling out the clock path duty-cycle distortion, the respective duty cycle distortions associated with clock signal 1201 and clock signal 1202 may be determine with a greater accuracy.

It is noted that during the transition from time period 1205 to time period 1206, output clock signal 1204 may have a duty cycle inconsistent with either of clock signals 1201 and 1202. Such inconsistencies may be taken into account by a duty cycle measurement circuit (e.g., measurement circuit 103).

Figure 13:
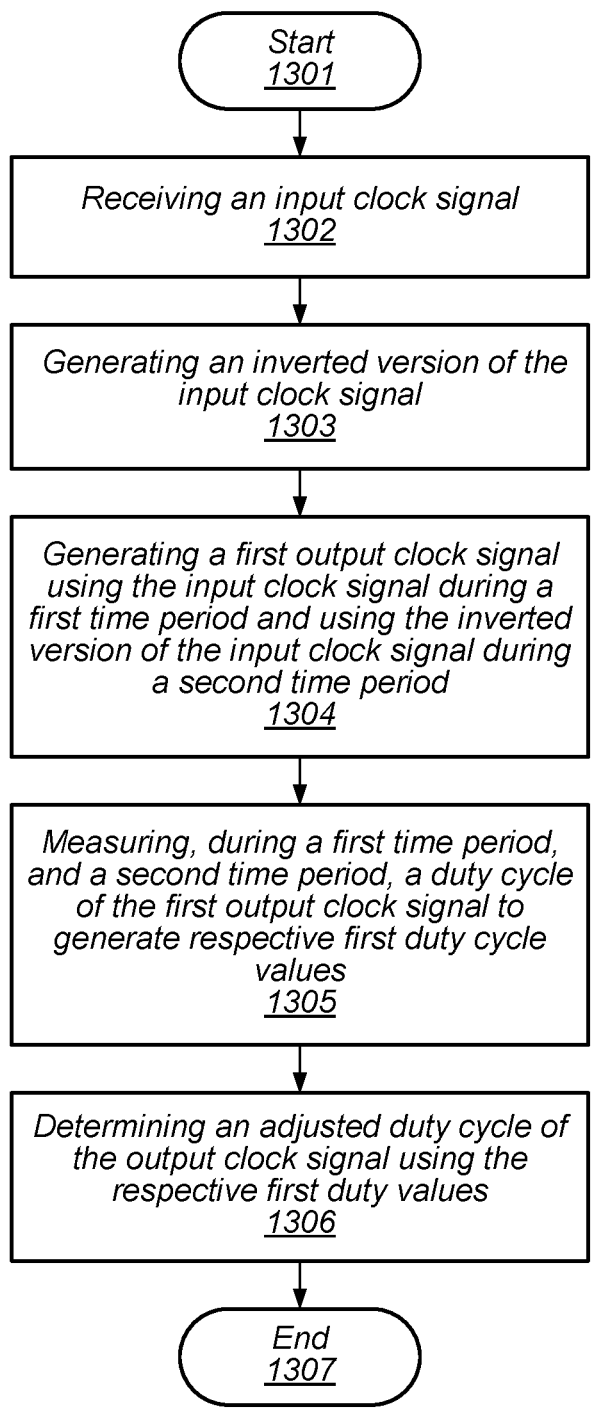
FIG. 13 illustrates a flow diagram depicting an embodiment of a method for operating a clock test system.

In FIG. 13, a flow diagram depicting an embodiment of a method for operating a clock test system is illustrated. The method, which may be applied to various clock test systems (e.g., clock test system 100), begins in block 1301.

The method includes receiving an input clock signal (block 1302). In various embodiments, the input clock signal may be received from a clock generator circuit and may be a single-ended clock signal or a differential clock signal.

The method further includes generating an inverted version of the input clock signal (block 1303). In some cases, generating the inverted version of the input clock signal includes activating, during a first time period, a buffer circuit configured to receive the input clock signal, and activating, during a second time period, an inverter circuit configured to receive the input clock signal.

The method also includes generating a first output clock signal using the input clock signal and the inverted version of the input clock signal (block 1304). In various embodiments, generating the output clock signal includes selecting, during a first time period, the input clock signal as the output clock signal, and selecting, during a second time period, the inverted version of the input clock signal as the output clock signal.

In some cases, the method may also include generating a second output clock signal using the input clock signal and the inverted version of the input clock signal, where the first output clock signal and the second output clock signal are included in a differential clock signal. In various embodiments, generating the second output clock signal includes selecting, during the first time period, the inverted version of the input clock signal as the second output clock signal, and selecting, during the second time period, the input clock signal as the second output clock signal.

The method further includes measuring, during a first time period and a second time period, a duty cycle of the first output clock signal to generate respective first duty cycle values (block 1305). The method, may in some cases, also include measuring, during the first time period and the second time period, a second duty cycle of the second output clock signal to generate respective second duty cycle values.

The method also includes determining an adjusted duty cycle of the output clock signal using the respective first duty values (block 1306). In some embodiments, determining the adjusted duty cycle includes subtracting the respective first duty cycles from one another. The method may, in some embodiments, also include determining a duty cycle of the differential clock signal using the respective first duty cycle values and the respective second duty cycle values. The method concludes in block 1307.

Figure 14:
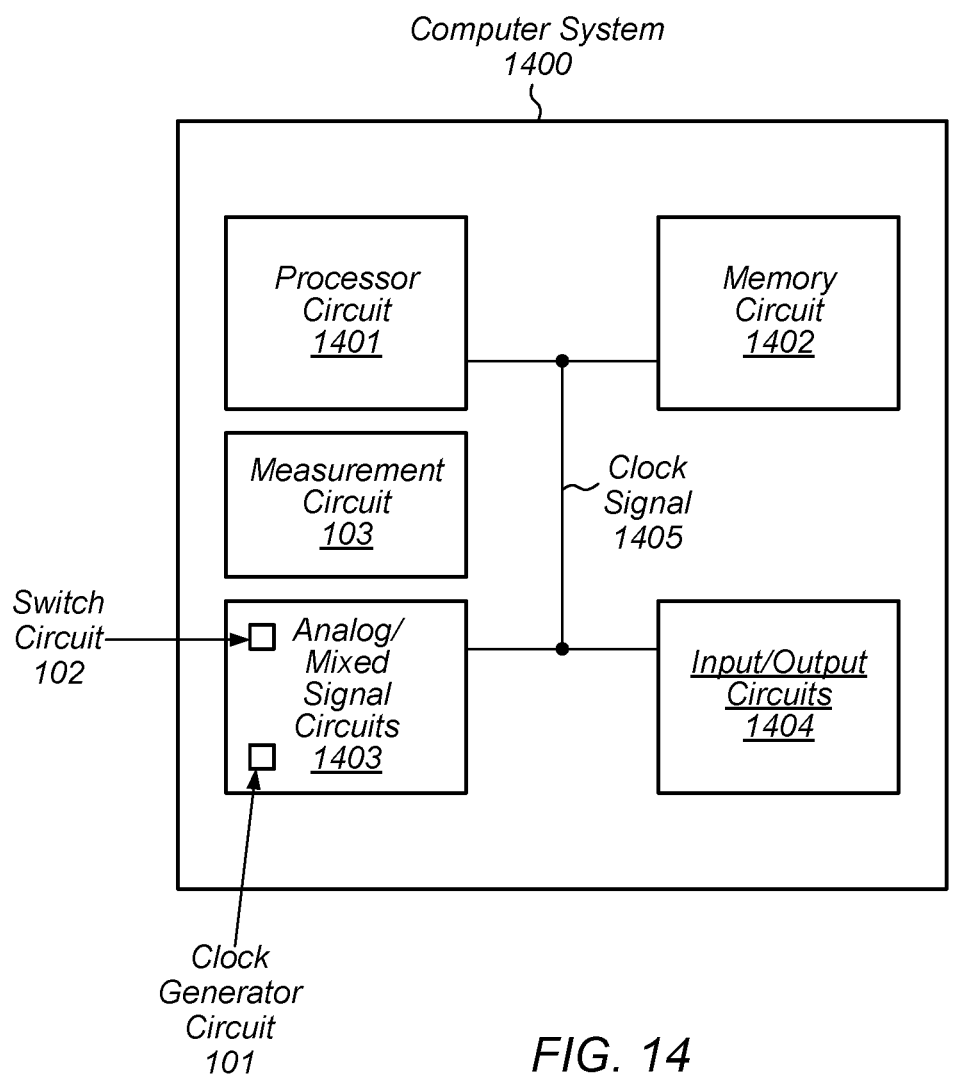
FIG. 14 is a block diagram of an embodiment of a computer system that includes a clock sub-system.

A block diagram of computer system is illustrated in FIG. 14. As illustrated, computer system 1400 includes analog/mixed-signal circuits 1403, processor circuit 1401, memory circuit 1402, and input/output circuits 1404, each of which is coupled to clock signal 1405. Computer system 1400 also includes measurement circuit 103. In various embodiments, computer system 1400 may be a system-on-a-chip (SoC) and be configured for use in a desktop computer, server, or in a mobile computing application such as, a tablet, laptop computer, or wearable computing device. It is noted that in cases where computer system 1400 is an SoC, measurement circuit 103 may be located in the SoC or it may be located on a separate integrated circuit.

Processor circuit 1401 may, in various embodiments, be representative of a general-purpose processor that performs computational operations. For example, processor circuit 1401 may be a central processing unit (CPU) such as a microprocessor, a microcontroller, an application-specific integrated circuit (ASIC), or a field-programmable gate array (FPGA).

Memory circuit 1402 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that in the embodiment of a computer system in FIG. 14, a single memory circuit is depicted. In other embodiments, any suitable number of memory circuits may be employed.

Analog/mixed-signal circuits 1403 may include a crystal oscillator circuit, a phase-locked loop (PLL) circuit, an analog-to-digital converter (ADC) circuit, and a digital-to-analog converter (DAC) circuit (all not shown). As illustrated, analog/mixed-signal circuit 1403 includes clock generator circuit 101 and switch circuit 102. In some embodiments, analog/mixed-signal circuits 1403 may be configured to perform power management tasks with the inclusion of on-chip power supplies and voltage regulators.

Input/output circuits 1404 may be configured to coordinate data transfer between computer system 1400 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1404 may be configured to implement a version of Universal Serial Bus (USB) protocol or IEEE 1394 (Firewire®) protocol.

Input/output circuits 1404 may also be configured to coordinate data transfer between computer system 1400 and one or more devices (e.g., other computing systems or integrated circuits) coupled to computer system 1400 via a network. In one embodiment, input/output circuits 1404 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1404 may be configured to implement multiple discrete network interface ports.

Input/output circuits 1404 may also be configured to coordinate data transfer between computer system 1400 and one or more devices (e.g., other computing systems or integrated circuits) coupled to computer system 1400 via a network. In one embodiment, input/output circuits 1404 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1404 may be configured to implement multiple discrete network interface ports.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated, including the following: Claim 3 (could depend from any of claims 1-2), claim 4 (could depend from any of claims 1-4), claim 5 (could depend from any of claims 1-4), claim 6 (could depend from any of claims 1-4), claim 12 (could depend from any of claims 8-11), claim 17 (could depend from any of claims 14-16), claim 18 (could depend from any of claims 14-16), and claim 19 (could depend from any of claims 14-17). Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such as "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
   a clock generator circuit configured to generate a plurality of clock signals having a common frequency;
   a switch circuit coupled to the clock generator circuit, wherein the switch circuit is configured to:
      select, during a first time period of a plurality of time periods, a first clock signal of the plurality of clock signals as a first output clock signal; and
      select, during a second time period of the plurality of time periods, a second, different clock signal of the plurality of clock signals as the first output clock signal; and
   a measurement circuit configured to:
      measure a duty cycle of the first output clock signal during the first and second time periods to generate respective first duty cycle values; and
      determine an adjusted duty cycle of the first output clock signal using the respective first duty cycle values.

2. The apparatus of claim 1, wherein the switch circuit includes a driver circuit, and a plurality of switches, wherein a first switch of the plurality of switches is configured to couple, using a first control signal, the first clock signal to an input of the driver circuit during the first time period, wherein a second switch of the plurality of switches is configured to couple, using a second control signal, the second clock signal to the input of the driver circuit during the second time period, and wherein the driver circuit is configured to generate the first output clock signal using a voltage level at the input of the driver circuit.

3. The apparatus of claim 2, wherein the switch circuit is further configured to couple the input of the driver circuit to ground in response to a de-assertion of an enable signal.

4. The apparatus of claim 2, wherein the switch circuit is further configured to:
   select, during the first time period, the second clock signal as a second output clock signal; and
   select, during the second time period, the first clock signal as the second output clock signal; and
   wherein the first clock signal and the second clock signal are differential clock signals.

5. The apparatus of claim 4, wherein the measurement circuit is further configured to:
   measure a duty cycle of the second output clock signal during the first and second time periods to generate respective second duty cycle values; and
   determine an adjusted duty cycle of the differential clock signal using the respective first and second duty cycle values.

6. The apparatus of claim 4, wherein the switch circuit further includes a second driver circuit, and a second plurality of switches, wherein a third switch of the second plurality of switches is configured to couple, using a third control signal, the second output clock signal to an input of the second driver circuit.

7. The apparatus of claim 1, wherein to determine the adjusted duty cycle, the measurement circuit is further configured to subtract the respective first duty cycle values to cancel a portion of duty cycle distortion associated with a static offset.

8. A method, comprising:
   receiving an input clock signal;
   generating an inverted version of the input clock signal;

generating a first output clock signal using the input clock signal during a first time period and using the inverted version of the input clock signal during a second time period;

measuring, during the first time period and the second time period, a duty cycle of the first output clock signal to generate respective first duty cycle values; and determining an adjusted duty cycle of the first output clock signal using the respective first duty cycle values.

9. The method of claim 8, further comprising holding the first output clock signal to a given logic value in response to an assertion of a disable signal.

10. The method of claim 8, wherein determining the adjusted duty cycle includes subtracting the respective first duty cycle values from one another.

11. The method of claim 8, further comprising:

generating a second output clock signal using the input clock signal and the inverted version of the input clock signal, wherein the first output clock signal and the second output clock signal are differential clock signals; and measuring, during the first time period and the second time period, a second duty cycle of the second output clock signal to generate respective second duty cycle values; and determining a duty cycle of the differential clock signal using the respective first duty cycle values and the respective second duty cycle values.

12. The method of claim 11, wherein generating the second output clock signal includes:

during the first time period:
coupling the inverted version of the input clock signal to a first driver circuit; and
coupling the input clock signal to a second driver circuit;

during the second time period:
coupling the input clock signal to the first driver circuit; and
coupling the inverted version of the input clock signal to the second driver circuit.

13. The method of claim 8, wherein generating the inverted version of the input clock signal includes:

activating, during the first time period, a buffer circuit included in a driver circuit; and activating, during the second time period, an inverter circuit included in the driver circuit.

14. An apparatus, comprising:
an integrated circuit configured to:
generate an input differential clock signal that includes a first clock signal and a second clock signal;
select, during a first time period, a first clock signal as the first output clock signal;
select, during a second time period, a second clock signal as the first output clock signal; and a measurement circuit coupled to the integrated circuit, wherein the measurement circuit is configured to:
measure a first duty cycle of the first output clock signal during the first time period;
measure a second duty cycle of the first output clock signal during the second time period; and
determine an adjusted duty cycle of the first output clock signal using the first duty cycle and the second duty cycle.

15. The apparatus of claim 14, wherein to determine the adjusted duty cycle of the first output clock signal, the integrated circuit is further configured to subtract the first duty cycle from the second duty cycle.

16. The apparatus of claim 14, wherein the integrated circuit includes a first driver circuit and a second driver circuit, and wherein to generate the first output clock signal, the integrated circuit is further configured to, during the first time period, couple the first clock signal to the first driver circuit, and couple the second clock signal to the second driver circuit.

17. The apparatus of claim 16, wherein the integrated circuit is further configured to generate a second output clock signal using the input differential clock signal, and wherein the first output clock signal and the second output clock signal are included in an output differential clock signal.

18. The apparatus of claim 17, wherein the measurement circuit is further configured to
measure a third duty cycle of the second output clock signal during the first time period;
measure a fourth duty cycle of the second output clock signal during the second time period; and
determine a duty cycle value of the first output clock signal using the first, second, third, and fourth duty cycle.

19. The apparatus of claim 17, wherein to generate the second output clock signal, the integrated circuit is further configured to:
select, during the first time period, the second input clock signal as the second output clock signal; and
select, during the second time period, the first input clock signal as the second output clock signal.

20. The apparatus of claim 14, wherein the integrated circuit is further configured to set the first output clock signal to a particular value in response to a detection of a disable condition.

* * * * *